United States Patent [19]

Strunka

[11] Patent Number: 5,093,183

[45] Date of Patent: Mar. 3, 1992

[54] PRINTED CIRCUIT BOARD WITH LAYER AND ORDER OF ASSEMBLY IDENTIFICATION

[75] Inventor: John E. Strunka, Poway, Calif.

[73] Assignee: Sundstrand Corporation, Rockford, Ill.

[21] Appl. No.: 581,874

[22] Filed: Sep. 13, 1990

[51] Int. Cl.$^5$ ............................................. B32B 9/00
[52] U.S. Cl. ................................. 428/195; 428/209; 428/220; 428/901; 361/397; 174/250; 427/96
[58] Field of Search ................... 361/397; 174/250; 428/195, 209, 901, 220; 427/96

[56] References Cited

U.S. PATENT DOCUMENTS

| Re. 28,506 | 8/1975 | Quaintance et al. | 428/418 |
| 3,272,909 | 9/1966 | Bruck et al. | 174/685 |
| 3,765,994 | 10/1973 | Quaintance et al. | 428/458 |
| 4,706,167 | 11/1987 | Sullivan | 430/313 |

FOREIGN PATENT DOCUMENTS 9002640  3/1990  World Int. Prop. O. .

Primary Examiner—Patrick J. Ryan
Attorney, Agent, or Firm—Antonelli, Terry, Stout & Kraus

[57] ABSTRACT

In a method for determining the layering sequence of a plurality of layers of a multilayered member, and a multilayered member which permits such method to be performed, a relatively translucent portion is provided in each of the layers. The relatively translucent portions are superimposed on one another in the member and each is provided with at least one relatively opaque indicium which is similar in appearance to the indicia in the other layers. The indicia are arranged in the portions such that in the multilayer member, as viewed from one end of the superimposed portions, they appear to be arranged in a predetermined array. Differences in clarity in the appearance of the indicia in the array make it possible to visually confirm or not the proper layering sequence of the layers of the member. The multilayered member is preferably a printed circuit board where the indicia are arranged in a sequence in the predetermined array according to the desired layering sequence. Bars of the same shape and size can be employed as the indicia, preferably in combination with respective ones of a sequence of numbers applied to the layers according to a desired layering sequence.

26 Claims, 2 Drawing Sheets

PRINTED CIRCUIT BOARD WITH LAYER AND ORDER OF ASSEMBLY IDENTIFICATION

DESCRIPTION

1. Technical Field

The present invention relates to a multilayered member, particularly a printed circuit board, and a method for determining whether or not the layering sequence of a plurality of layers of such a member is proper.

2. Background Art

When inspecting a laminated, metal clad plastic sheet printed circuit board, it cannot be determined if all inner layers of the circuit board have been assembled in correct layer sequencing order. If a defective printed circuit board is manufactured with a layer in incorrect order, the printed circuit board can be otherwise inspected and assembled into an electrical device and the problem of incorrect layering will not be detected unless an associated coupon is dissected. That is, heretofore, the only alternative to avoid use of such an incorrectly layered printed circuit board has been a destructive examination of the printed circuit board to determine layer sequencing order. This limitation of known printed circuit boards is problematical where proper layering sequence of the layers in the printed circuit board is important or critical, such as in those applications where signals in respective laminates of the board must be isolated from one another by intermediate laminates of the board.

It is known in the art that the individual laminates of a printed circuit board can be numbered. For example, U.S. Pat. No. 3,272,909 discloses a printed circuit package with indicia wherein the insulating portions of the individual laminates of the circuit board are numbered in order to provide an indication of the total number of laminates in the circuit package. However, this printed circuit package with indicia and the disclosed method do not permit a determination of whether or not the layers of the board are arranged in proper sequence.

DISCLOSURE OF INVENTION

An object of the present invention is to overcome the aforementioned problem associated with known printed circuit boards. More particularly, an object of the invention is to provide an improved multilayered member, such as a printed circuit board, and a novel method for determining whether or not the layers of the member are arranged in proper sequence.

These and other objects of the invention are attained by the multilayered member of the invention, and the related method, wherein the member comprises a plurality of layers which are each provided with a relatively translucent portion which is positioned in the layer such that when the layers are assembled in the member the relatively translucent portions of the layers are superimposed on one another. Each of the relatively translucent portions has at least one relatively opaque indicium located therein and having a similar appearance to the at least one indicium provided in each of the relatively translucent portions of the other layers. The at least one relatively opaque indicium in each relatively transparent portion is positioned in its portion such that when the multilayered member is viewed from one end of the superimposed portions the indicia appear to be arranged in a predetermined array whereby, from differences in clarity in the appearance of the indicia, it can be determined whether or not the layers are arranged in proper sequence in the multilayered member.

In a preferred embodiment of the invention, the indicia in the predetermined array are arranged sequentially according to the desired order or sequence of the layers in the multilayered member. As a result, the clarity of the indicia in the predetermined array will change progressively along the sequence of the indicia in the array when the layers are properly sequenced in the member, but appear otherwise relative to one another if the layers are not correctly ordered. Thus, by a quick visual inspection, it is possible to determined whether or not the layering sequence of the layers in the member is proper.

The predetermined array is a linear array in the disclosed, preferred embodiment of the invention, wherein the indicia are arranged in spaced relation. The relatively opaque indicia are in the form of bars which have the same size and shape, but other similarly appearing indicia could be employed for facilitating visual detection by the relative differences in clarity associated with different numbers of the relatively translucent portions overlaying the respective indicia. The relatively translucent portions of the layers are rectangular in the illustrated embodiment to permit viewing of the linear, predetermined array of the indicia, but other configurations for the portions could be employed, depending upon the shape of the predetermined array of relatively opaque indicia to be viewed within the relatively translucent portions.

The multilayered member according to the preferred embodiment is a printed circuit board. The plurality of layers of the member are laminates which are bonded to one another to form the printed circuit board. Each laminate is preferably formed of a relatively translucent plastic sheet which is metal cladding for forming printed circuitry thereon. According to the preferred embodiment, the same metal clad used to form the printed circuitry is also used to provide the relatively opaque indicia in the relatively translucent portions. Preferably the indicia are formed at the same time as the printed circuitry. In the illustrated embodiment, the relatively translucent portions of the layers are also numbered sequentially in accordance with a desired layering sequence in the printed circuit board. The numbers aid in identifying which bar belongs to which layer or laminate of the printed circuit board.

From the above, it can be seen that the method of the invention for determining whether or not the layering sequence of a plurality of layers of a multilayered member is proper comprises providing each of a plurality of layers with a relatively translucent portion which is positioned in the layer such that when the layers are arranged in the multilayered member the relatively translucent portions of the layers are superimposed on one another, and wherein the relatively translucent portions are each provided with at least one relatively opaque indicium located therein which has a similar appearance to the at least one indicium provided in each of the relatively translucent portions of the other layers, and wherein the at least one relatively opaque indicium in each relatively translucent portion is positioned in its portion such that when the layers are arranged in the multilayered member the indicia of the plurality of layers are arranged in a predetermined array. Further, according to the method, when the layers are arranged in the multilayered member, the predetermined array of indicia in the superimposed relatively translucent portions of the layers is viewed and from differences in clarity in the appearance of the similar indicia it is determined whether or not the layering sequence of the layers of the member is proper. Where the member comprises many layers, for example twelve to fifteen layers or laminates, it is preferable that the method further includes the step of holding the printed circuit board up towards a source of light to facilitate said viewing step.

These and other objects, features and advantages of the present invention will become more apparent from the following description when taken in connection with the accompanying drawings, which show, for purposes of illustration only, one embodiment in accordance with present invention.

BEST MODE FOR CARRYING OUT THE INVENTION

Figure 1:
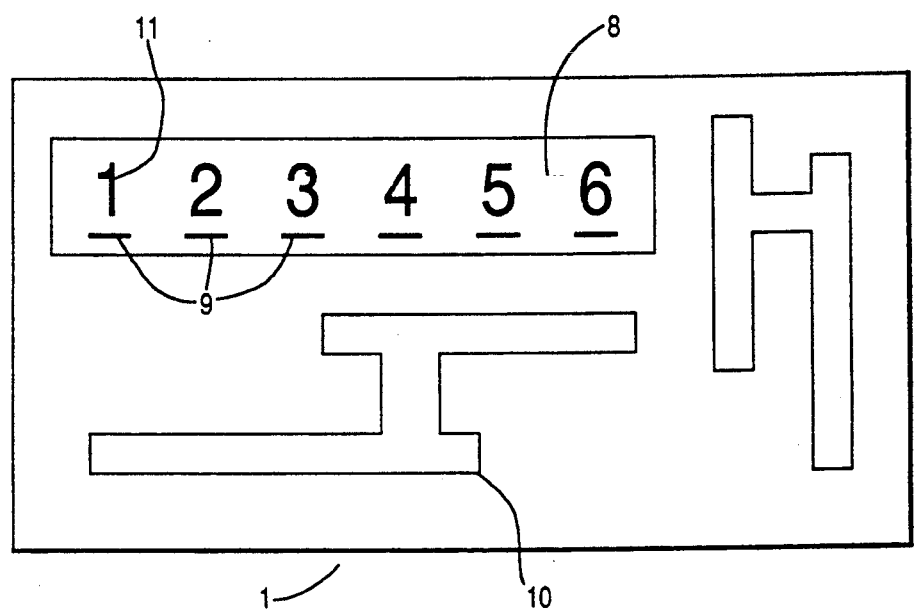
FIG. 1 is an enlarged, partially schematic top view of a multilayered printed circuit board of the invention.

Referring now to the drawings, a multilayered member 1 in the form of a printed circuit board according to the invention comprises a plurality of layers or laminates 2-7 which are glued or otherwise bonded together to form the printed circuit board. While for the purposes of illustration the number of layers in the printed circuit board is six, the printed circuit board could be formed with a different number of layers. For example, twelve or as many as eighteen layers can be used. Each layer or laminate of the board is preferably formed of an insulating plastic sheet with metal clad printed circuitry, such as that shown at 10 in FIG. 1, formed thereon. One suitable material for the plastic sheets of the layers is epoxy resin. The sheets can be plated with copper and selectively etched, for example, to form the printed circuitry 10 thereon. More particularly, the layers 2-7 can be formed according to U.S. government specification MIL-p-13949. Each layer is relatively thin, for example, on the order of 0.005-0.010 inch thick, such that the total thickness of the composite circuit board of the bonded layers is only a sixteenth to an eighth inch thick.

The thin plastic sheet of each of the layers 2-7 is normally translucent to some extent in the absence of a metal cladding thereon. When the layers are copper plated to form the printed circuitry, the layers are not translucent in the metal clad areas. The color of the plastic sheets may be green, white, light beige or, in some instances, almost clear. According to the invention, each of the layers 2-7 is provided with a relatively translucent portion 8 by not metal plating the plastic sheets of the layers in the rectangular area 8. Alternatively, a metal plating can be applied and then selectively removed in the portions 8 as during formation of the printed circuitry 10. Thus, the portions 8 are formed of the material of the plastic sheets of the layers, which material is relatively translucent. The relatively translucent portions 8 are positioned in the layers such that they are superimposed on one another when the layers are stacked and bonded to form the multilayered printed circuit board. The portions 8 can be located in the layers within an area of the printed circuitry 10 or in a border area thereof.

Each of the relatively translucent portions 8 of the layers is provided with at least one relatively opaque indicium 9 located therein and having a similar appearance to the at least one indicium 9 provided in each of the relatively translucent portions 8 of the other layers. Further, the at least one relatively opaque indicium 9 in each relatively translucent portion 8 is positioned such that when the board 1 formed of the layers 2-7 is viewed from the upper end of the superimposed portions 8, the indicia 9 are arranged in a predetermined array, see FIG. 1. As a result of this, from differences in clarity in the appearance of the indicia in the array it can be determined whether or not the layering sequence of the layers in the multilayered member is proper.

Figure 2:
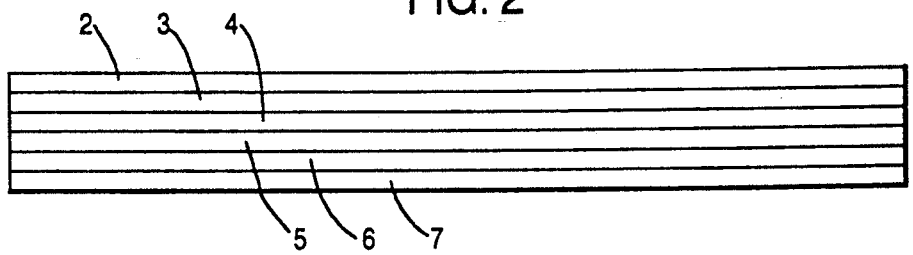
FIG. 2 is a side view of the printed circuit board of FIG. 1 showing the edges of the plurality of layers of the board which are bonded to one another to form the board.
Figure 3:
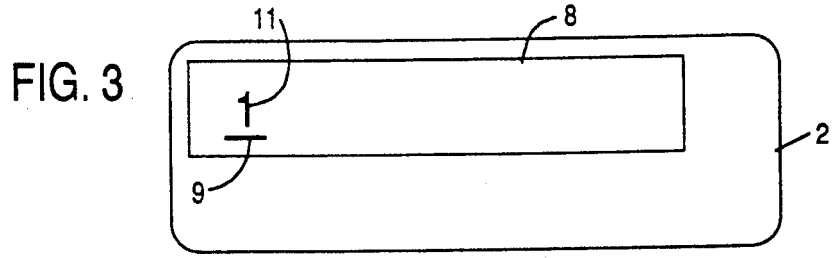
FIG. 3 through 8 are top views of respective ones of the plurality of layers of the printed circuit board of FIGS. 1 and 2 showing the relatively translucent portions and the relatively opaque indicia therein before assembling in the printed circuit board the printed circuitry on each layer not being shown.
Figure 4:
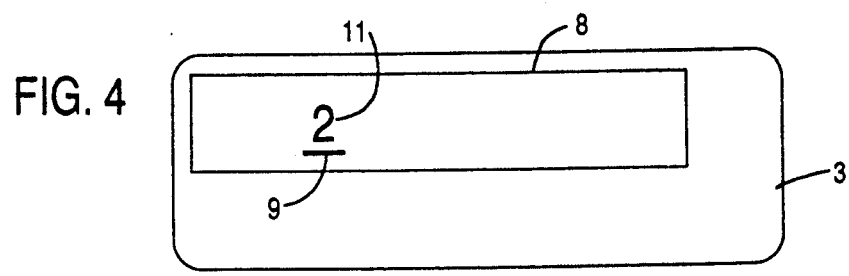
Figure 5:
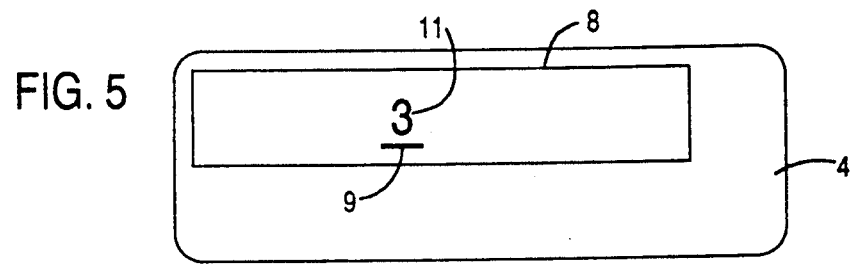
Figure 6:
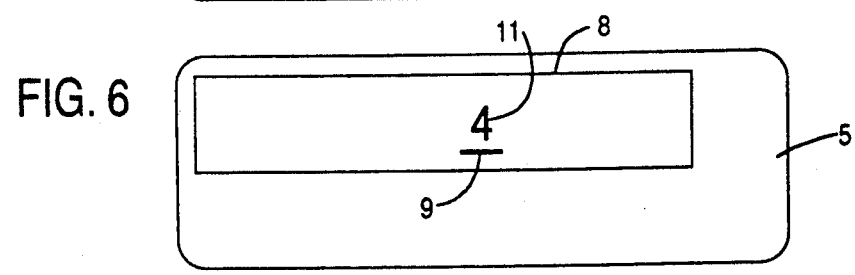
Figure 7:
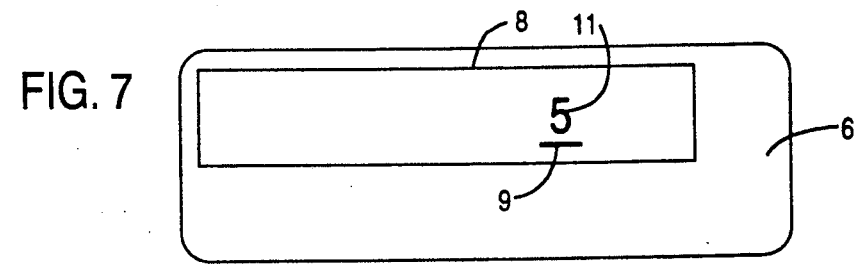
Figure 8:
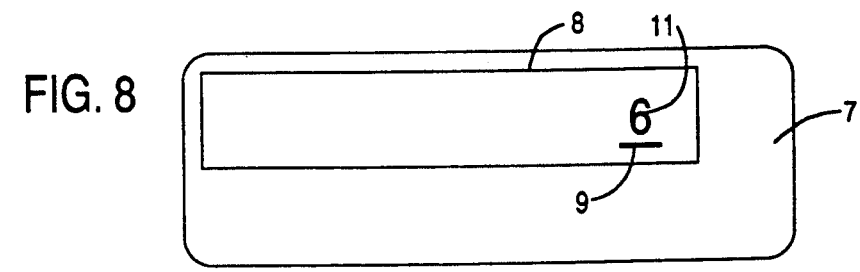

The indicia 9 in the illustrated embodiment are in the form of bars which have the same shape and size, but other indica could be employed. The bars 9 are preferably formed of the same metal cladding as the printed circuitry 10 of the layer, namely copper, so that the indicia 9 are opaque. The indicia are preferably formed at the same time as the printed circuitry for efficiency in manufacturing. The disclosed predetermined array of the indicia 9 is a linear array wherein the indicia are arranged in spaced relation as illustrated in FIG. 1. The indicia in the array are visible within the superimposed portions 8 of the layers when light passes through the relatively translucent portions. For this purpose, if necessary, particularly in the case of printed circuit boards having a relatively large number of layers, the viewing of the opaque indicia within the translucent portions is facilitated by holding up the circuit board to a light. Relatively opaque numbers 11 are also located in the translucent portions 8 adjacent the bars 9. More particularly, the layers are preferably numbered with respective ones of a sequence of numbers in the desired order of layering as evident from FIGS. 3-8, taken with FIGS. 1 and 2. The numbers can also be formed of the same metal as the printed circuitry on the plastic sheets of the layers.

Using a bar in combination with the numeric identification of each layer of the printed circuit board helps to identify which bar belongs to which layer and indicates the presence of the given number of different layers in the board. The bars themselves provide a means by which the layers can be visually identified in such a way that an incorrect order of assembly can be identified by the "shading" or "intensity" of the bars which should vary sequentially, as evident in FIG. 1, if the layers are assembled in the proper order. As viewed in FIG. 1, the layer with the number 6 thereon is the lowermost layer in the stack of the printed circuit board, the numbered layer 5 is arranged on top of the layer numbered 6, the layer numbered 4 is arranged upon the layer numbered 5, etc. The loss of clarity of the bars with increasing depth in the printed circuit board from the surface of the board viewed is evident in FIG. 1. Because the bars have a similar appearance, e.g. a similar size and shape, a person can readily visually detect when the layers are not in proper sequence by the relative appearance of the adjacent bars in the array thereby avoiding assembly of an improperly layered board into an electrical device.

As noted above, preferably the indicia in the predetermined array are arranged sequentially according to the desired order of the layers in the printed circuit board so that the clarity thereof progressively changes in the sequence of the indicia in the array when the layers are properly sequenced, but appears otherwise when the layers are improperly sequenced.

The multilayered member 1 of the invention and the associated method for determining the layering sequence of a plurality of layers of the multilayered member have been illustrated in connection with a printed circuit board according to the preferred embodiment. However, the invention is useful for determining whether or not the layering sequence of other multilayered members is proper as will be readily apparent to the skilled artisan.

While I have shown and described only one embodiment in accordance with the present invention, it is understood that the same is not limited thereto, but is susceptible to numerous changes and modifications as known to those skilled in the art. Therefore, I do not wish to be limited to the details shown and described herein, but intend to cover all such changes and modifications as are encompassed by the scope of the appended claims.

I claim:

1. A multilayered member comprising a plurality of layers for which there is a proper layering sequence, each of said layers being provided with a translucent portion which is positioned in the layer such that the translucent portions of the respective layers are superimposed on one another, said translucent portions of the layers comprising means for visually determining whether or not the layering sequence of the layers is the proper layering sequence, said means for visually determining comprising each of the translucent portions being provided with at least one relatively opaque indicium located therein and having a similar size and shape to the at least one indicium provided in each of the translucent portions of the other layers, the at least one opaque indicium in each translucent portion being positioned in its portion such that when the multilayered member is viewed from one end of the superimposed portions the indicia appear to be arranged in an array which bears a known relationship to the proper layering sequence whereby from difference in clarity in the appearance of the indicia it can be determined whether or not the layering sequence of the layers in the multilayered member is proper.

2. The multilayered member according to claim 1, wherein the indicia are in the form of bars.

3. The multilayered member according to claim 1, wherein the indicia have the same size and shape.

4. The multilayered member according to claim 1, wherein said is a linear array of the indicia.

5. The multilayered member according to claim 1, wherein the indicia are arranged in spaced relation in said array.

6. The multilayered member according to claim 1, wherein said multilayered member is a printed circuit board.

7. The multilayered member according to claim 6, wherein the layers are laminates of the printed circuit board which are bonded to one another.

8. The multilayered member according to claim 1, wherein each of said layers is provided with an opaque number in its translucent portion adjacent the at least one opaque indicium therein.

9. The multilayered member according to claim 8, wherein said layers are numbered with respective ones of a sequence of numbers.

10. The multilayered member according to claim 1, wherein the multilayered member is a printed circuit board and the layers are laminates of the printed circuit board which are formed of plastic sheets with metal clad printed circuitry thereon, the opaque indicia being formed of the same metal as the printed circuitry.

11. The multilayered member according to claim 10, wherein the translucent portions are rectangular.

12. The multilayered member according to claim 1, wherein the indicia in the array are arranged sequentially according to the desired order of the layers in the multilayered member so that the clarity thereof progressively changes in the sequence of the indicia in the array when the layers are properly sequenced, but appears otherwise when the layers are improperly sequenced.

13. A method for determining the layering sequence of a plurality of layers of a multilayered member comprising providing each of a plurality of layers with a translucent portion which is positioned in the layer such that when the layers are arranged in the multilayered member the translucent portions of the layers are superimposed on one another, and wherein said translucent portions are each provided with at least one opaque indicium located therein which has a similar size and shape to the at least one indicium provided in each of the translucent portions of the other layers, and wherein the at least one opaque indicium in each translucent portion is positioned in its portion such that when the layers are arranged in the multilayered member the indicia of the plurality of layers are arranged in an array which bears a known relationship to a proper layering sequence, assembling the layers to form the multilayered member, viewing the array of indicia in the superimposed translucent portions of the layers and from differences in clarity in the appearance of the indicia determining whether or not the layering sequence of the layers of the member is proper.

14. The method according to claim 13, wherein said step of viewing and determining includes holding the multilayered member up toward light to facilitate said viewing.

15. The method according to claim 13, wherein said providing step further includes numbering each of said layers in its translucent portion with a opaque number adjacent the at least one indicium therein.

16. The method according to claim 15, wherein said layers are numbered sequentially to identify the proper layering sequence in the multilayered member.

17. The method according to claim 13, wherein said multilayered member is a printed circuit board, and said step of assembling including assembling the layers to form the printed circuit board.

18. The method according to claim 17, including bonding said layers of the printed circuit board to one another.

19. The method according to claim 13, wherein said layers include plastic sheets and said providing includes forming a metal cladding on the plastic sheets to form the opaque indicia thereon.

20. The method according to claim 19, wherein said layers are laminates of a printed circuit board formed of the plastic sheets with metal clad printed circuitry thereon which is formed of the same metal as the opaque indicia.

21. The method according to claim 13, wherein said providing includes positioning the indicia in an array wherein the indicia are arranged sequentially according to the proper order of the layers in the multilayered member so that the clarity of the indicia progressively changes in the array when the layers are properly sequenced, but appears otherwise if the layers are not properly sequenced in the multilayered member.

22. The method according to claim 13, wherein the indicia are in the form of bars.

23. The method according to claim 13, wherein the indicia have the same size and shape.

24. The method according to claim 13, wherein said array is a linear array.

25. The method according to claim 13, wherein said indicia are arranged in spaced relation in said array.

26. The method according to claim 13, wherein the translucent portions are rectangular.

* * * * *